United States Patent [19]

Burgess et al.

[11] Patent Number: 4,539,058
[45] Date of Patent: Sep. 3, 1985

[54] FORMING MULTILAYER CERAMIC SUBSTRATES FROM LARGE AREA GREEN SHEETS

[75] Inventors: Allan C. Burgess, Yorktown Heights; Robert A. Magee; George E. Melvin, both of Poughkeepsie, all of N.Y.

[73] Assignee: International Business Machines Corporation, Armonk, N.Y.

[21] Appl. No.: 560,099

[22] Filed: Dec. 12, 1983

[51] Int. Cl.³ .............................................. B32B 31/18
[52] U.S. Cl. .................................. 156/250; 156/261; 156/264; 156/350; 156/351; 156/510; 156/512; 156/530
[58] Field of Search .................... 156/64, 89, 245, 250, 156/256, 261, 264, 510, 512, 518, 528, 530, 378, 379, 350, 351; 29/825, 826, 830, 833, 834, 835, 836

[56] References Cited

U.S. PATENT DOCUMENTS

| | | | |
|---|---|---|---|
| 3,235,939 | 2/1966 | Rodriguez et al. | 29/25.42 |
| 3,518,756 | 7/1970 | Bennett et al. | 29/625 |
| 3,546,766 | 12/1970 | Rodriguez et al. | 29/626 |
| 4,030,190 | 6/1977 | Varker | 29/625 |
| 4,237,606 | 12/1980 | Niwa et al. | 29/830 |
| 4,342,090 | 7/1982 | Caccoma et al. | 364/491 |
| 4,345,955 | 8/1982 | Bakermans et al. | 156/89 |

FOREIGN PATENT DOCUMENTS 37768  3/1977  Japan .................................... 29/833

OTHER PUBLICATIONS

IBM Technical Disclosure Bulletin, vol. 21, No. 11, Apr. 1979, "X-Y Positioning System for Punching", Y. Darves-Bornoz, R. A. Magee & D. J. McAttee, pp. 4473-4475.
Solid State Technology, May 1972, "A Fabrication Technique for Multilayer Ceramic Modules", H. D. Kaiser, F. J. Pakulski & A. F. Schmeckenbecher, pp. 35-40.

Primary Examiner—Caleb Weston
Attorney, Agent, or Firm—Anne Vachon Dougherty; Mitchell S. Bigel; John A. Jordan

[57] ABSTRACT

A method and apparatus for forming multilayer ceramic substrates from large area ceramic green sheets, each having an array of layer sites thereon, by serially aligning each individual layer site with respect to a die cavity and punching the aligned layer site into the die cavity to thereby stack the requisite number of aligned layer sites. Individual layer site alignment ensures that each layer site is aligned with respect to the die cavity so that the dimensional tolerances between layer sites on the large area green sheet are eliminated. Thus, as large a green sheet as is cost effective may be employed, notwithstanding the fact that dimensional distortions on the large area green sheet would preclude alignment of corresponding layer site vias on superimposed large area green sheets.

10 Claims, 3 Drawing Figures

FORMING MULTILAYER CERAMIC SUBSTRATES FROM LARGE AREA GREEN SHEETS

BACKGROUND OF THE INVENTION

1. Technical Field

This invention relates to multilayer ceramic integrated circuit packaging substrates, and more particularly to a method of and apparatus for forming multilayer ceramic integrated circuit packaging substrates from large area ceramic green sheets.

2. Background Art

The use of multilayer ceramic substrates for mounting and interconnecting integrated circuit devices is well known in the art as indicated by an article entitled "A Fabrication Technique for Multi-Layer Ceramic Modules", by H. D. Kaiser et al., Solid State Technology, May 1972, page 35-40. Multilayer ceramic substrates are typically formed from ceramic green sheets. An array of multilayer ceramic substrate layer sites is formed on a green sheet by punching a predetermined pattern of holes (vias) for each layer site and filling the vias with a conductive metal, typically molybdenum. A screened surface metallization pattern interconnects the metal filled vias in a layer site. Up to thirty or more green sheets are stacked, laminated and sintered to form a solid ceramic stucture. The solid ceramic structure is then cut or diced into individual multilayer ceramic substrates.

The above described process inherently limits the maximum green sheet size which may be employed to fabricate multilayer ceramic substrates. It would be desirable to use a large area green sheet having many layer sites thereon, because of the reduced cost per layer site for the above described green sheet fabrication, punching, and metallization steps. However, since the punching and metallization steps produce dimensional distortions in the green sheet, the number of layer sites that may be formed on a given green sheet must be limited in order to ensure alignment of vias in corresponding layer sites on two or more superimposed green sheets. Accordingly, via misalignment in corresponding layer sites of superimposed green sheets prevents the use of large area green sheets in the above described multilayer ceramic substrate fabrication process.

Another process for manufacturing multilayer ceramic substrates is disclosed in U.S. Pat. No. 3,546,776 to A. R. Rodriguez et al., wherein a plurality of green sheets, each of which has a plurality of metallized patterns repeated thereon at spaced intervals, are arranged in a stack so that the patterns of one sheet are vertically aligned with the different patterns on the other sheets. The stack of green sheets is punched into a die to form the layers of a multilayer ceramic substrate. The Rodriguez et al. technique also inherently limits the size of the green sheet which may be employed. For large area green sheets, dimensional tolerances preclude the vertical alignment of the patterns on one sheet with the different patterns on the other sheets. The Rodriguez et al. reference also discloses that individual layer sites may be punched into the die cavity from individual sheets; however, the use of a separate green sheet for each layer site drastically limits throughput and unit cost per multilayer ceramic substrate. Accordingly, the prior art has not suggested a method and apparatus for forming multilayer ceramic substrates from green sheets of unlimited size.

DISCLOSURE OF THE INVENTION

It is therefore an object of the invention to provide an improved method and aparatus for forming multilayer ceramic substrates.

It is another object of the invention to provide a method and apparatus for forming multilayer ceramic substrates from unlimited size green sheets, to thereby increase throughput and reduce unit cost.

It is yet another object of the invention to provide a method and apparatus for forming multilayer ceramic substrates which exhibit layer to layer alignment, notwithstanding the dimensional instability of the green sheets from which they are formed.

These and other objects are provided by a method and apparatus for fabricating multilayer ceramic substrates from large area ceramic green sheets. i.e., green sheets which are sufficiently large so as to preclude alignment of the vias in corresponding layer sites on superimposed green sheets. According to the invention, an individual layer site on a large area green sheet is aligned with respect to a die cavity. The aligned layer site is punched into the die cavity, and the aligning and punching steps are repeated to stack up the requisite number of aligned layer sites. The aligned and stacked layer sites are then laminated and sintered to form a multilayer ceramic substrate.

According to the invention, the above described layer site alignment ensures that each individual layer site is aligned with respect to the die cavity so that the dimensional tolerances between layer sites on the large area green sheet are eliminated. Thus, as large a green sheet as is cost effective may be employed during the green sheet fabrication, punching and metallizing steps. Each individual layer site is aligned at a mapping station at which the dimensional offset of a reference mark on the layer site from its intended nominal position on the large area green sheet is determined. The mapped layer site is then indexed over a die cavity with the dimensional offset being applied, in order to align the layer site features with the die cavity. The aligned layer site is then punched into the die cavity. According to another aspect of the invention, a shutter may be provided to cover the die cavity when the layer site is punched from the green sheet and when the punch clears the die cavity on the return stroke, to thereby prevent green sheet debris from entering the die cavity.

DETAILED DESCRIPTION OF THE INVENTION

Figure 1:
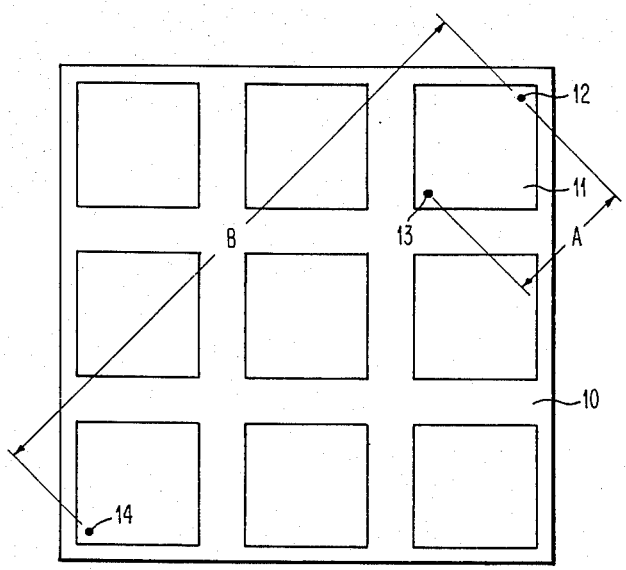
FIG. 1 illustrates a green sheet having an array of layer sites thereon.

Referring now to FIG. 1, a green sheet 10 having an array of layer sites thereon is illustrated. Green sheet 10 may be formulated from ceramic powder and organic binders in a conventional manner. As illustrated, green sheet 10 includes an array of nine layer sites thereon although more or less may be employed. Each layer site includes a pattern of conductive vias which may be interconnected by a surface conductive pattern in a well known manner.

It will be recognized by those having skill in the art that the maximum size of a layer site is dictated by the dimensional distorion between the most distant vias in the layer site, e.g., the distance A between vias 12 and 13 on upper right layer site 11. It will also be recognized that the maximum green sheet size and the maximum number of layer sites which may be fabricated on a green sheet are dictated by the dimensional distortion between the most distant vias on green sheet 10, e.g., the distance B between the upper right via 12 on the upper right layer site and the lower left via 14 on the lower left site. If the deviation of distance B from its nominal value is on the order of a via diameter, then the vias in corresponding layer sites on superimposed green sheets will not line up. Thus, prior art multiple layer site green sheet fabrication processes had to limit green sheet size so that the worst case dimensional distortion introduced by the punching and metallizing steps was sufficiently small to permit via alignment on superimposed green sheets.

Figure 2:
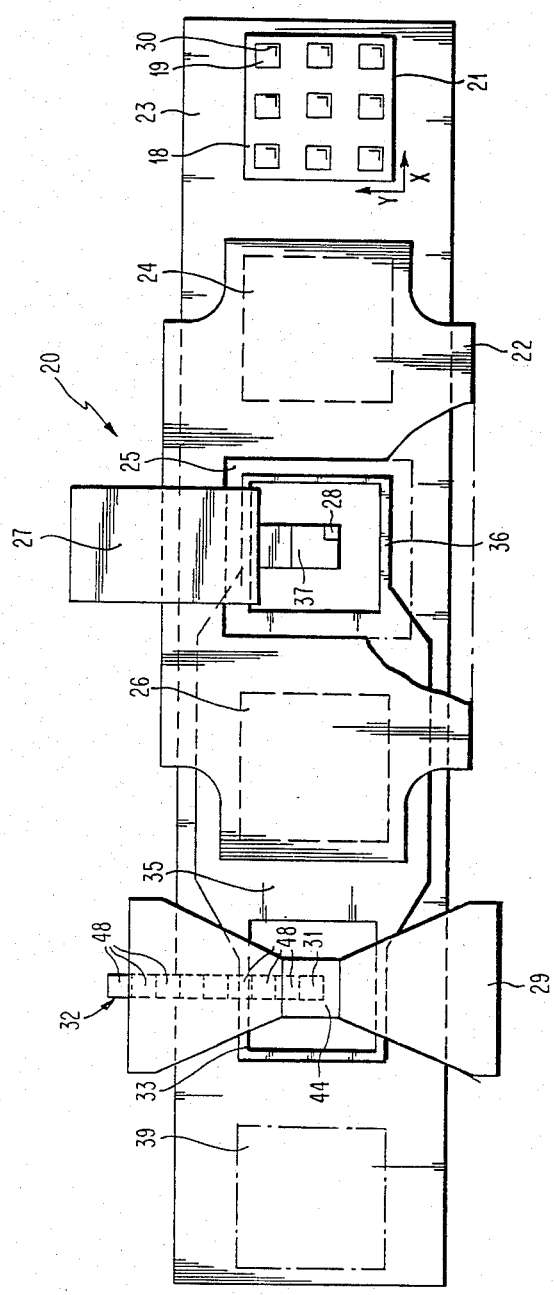
FIG. 2 illustrates an apparatus for forming multilayer ceramic substrates from large area green sheets according to the present invention.

According to the invention, the dimensional tolerances between layer sites on a large area green sheet are eliminated by aligning individual layer sites on the large area green sheet with respect to a die cavity and punching the aligned layer site into the die cavity. Referring now to FIG. 2, an apparatus for forming a multilayer ceramic substrate according to the present invention is shown. Apparatus 20 includes a green sheet handling carriage 22 which is moveable along base 23, to convey a green sheet 18 from green sheet input station 21 past green sheet mapping station 27 and green sheet punching station 29. At mapping station 27, the dimensional deviation of each fiducial mark 30 on respective green sheet layer site 19 from its nominal position is measured. The measured deviation is then employed for offsetting X-Y table 35 at punching station 29 so that each layer site 19 is aligned to punch 31 regardless of the shrinkage and distortion in green sheet 18.

The detailed operation of multilayer ceramic substrate fabricating apparatus 20 will be described for a large area green sheet having nine identical layer sites per green sheet, each of which includes a single fiducial mark. Multilayer ceramic substrate fabrication proceeds as follows: Carriage 22 proceeds to the right from the position shown in FIG. 2, and left carriage station 26 picks the top green sheet 18 from green sheet input station 21, using vacumm or other known mechanical means. Carriage 22 moves to the left, and left carriage station 26 drops the top green sheet onto the right station 36 of X-Y table 35. Simultaneously, right carriage station 24 picks up the next green sheet at input station 21. Carriage 22 continues moving left so that hole 25 therein is aligned with right station 36 of X-Y Table 35, as shown in FIG. 2.

X-Y Table 35 sequentially indexes each layer site 19 under head 37 of mapping station 27. The mechanical design of an X-Y Table is well known in the art and may be as described in IBM Technical Disclosure Bulletin, Vol. 21, No. 11, April 1979, pages 4473–4475, entitled "X-Y Positioning System for Punching".

Mapping station head 37 includes an array 28 of line scanning linear photodiodes, e.g., as supplied by EG&G Reticon, Sunnyvale, California, for measuring the offset or deviation $\Delta X$, $\Delta Y$, of each fiducial 30 on green sheet 18, from its nominal or undistorted location X, Y. For example, array 28 may be arranged so that when X-Y table 35 indexes to the nominal position X, Y of each fiducil 35, the nominal position is located at the datum (i.e., the origin) of the array. Then, the detected location of the fiducial 35 corresponds to the offset $\Delta X$, $\Delta Y$. It will be understood by those having skill in the art that other photodiode arrays, vidicon cameras or other optical or non-optical detection means may be employed. The values of $\Delta X$ and $\Delta Y$ for each layer site 19 are recorded in mapping station 27. Details of the deviation calculation and recording are not described herein, as such operations are commonly employed in optical detection or recognition systems.

After the X and Y deviation of all the layer sites have been measured, left carriage station 26 picks up top green sheet 18 from under head 37 of mapping station 27 and deposits it in the left station 33 of X-Y table 35 under punching station 29. Simultaneously, the next green sheet is dropped from right carriage station 24 and deposited under head 37 of mapping station 27. X-Y Table 35 indexes a layer site 19 over punch 31, with the previously recorded $\Delta X$ and $\Delta Y$ offsets being applied so that the layer site is aligned to punch 31. Then, punch 31 punches the aligned layer site into a die cavity 48 lying under punch 31. After punching, another layer site is indexed, aligned and punched into another one of cavities 48 so that after an entire green sheet is punched, one layer site is punched into each of die cavities 48.

It will also be noted that simultaneous with the punching of topmost green sheet 19, the next green sheet may be mapped at station 27. In order to properly calculate the $\Delta X$ and $\Delta Y$ offsets for the next green sheet while the first green sheet is being aligned and punched, the previously calculated $\Delta X$ and $\Delta Y$ offsets for the first green sheet must be algebraically added to the measured offsets for the next green sheet. After punching, the punched green sheet is placed in output station 39.

Figure 3:
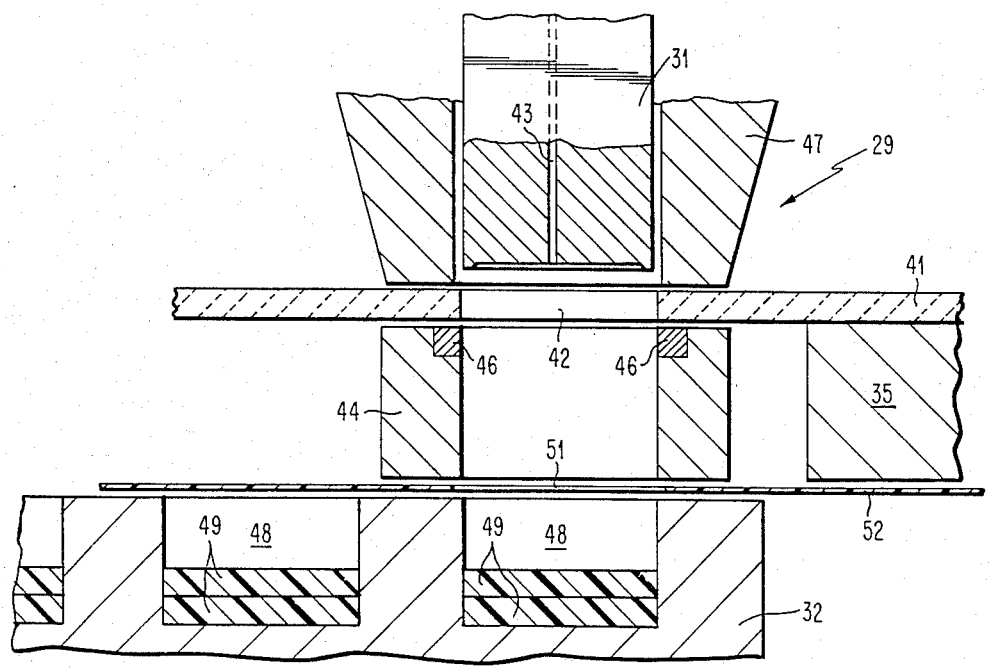
FIG. 3 illustrates a punching station which may be employed in the apparatus of FIG. 2 according to the present invention.

Referring now to FIG. 3, the details of punching station 29 are illustrated. Punching station 29 includes a punch 31 having a vacuum port 43 for holding the punched layer site 19 thereon, and a die block 44 having a carbide insert 46 for providing a punching surface. An appropriate layer site 42 on green sheet 41 is indexed under punch 31 by X-Y Table 35, with the proper $\Delta X$ and $\Delta Y$ offset being applied. The punch then punches the aligned layer site through die block 44 and deposits the punched layer site into a first die cavity 48 of die assembly 32. This cavity is located directly under punch 31 in FIG. 2.

Punching station 29 also includes a debris catching shutter 52 which may be a roll of polyester or the equivalent having a plurality of cavities 51 spaced thereon. On the downward stroke of punch 31, shutter 52 is positioned so that it blocks die cavity 48 and prevents any debris released from green sheet 18 during punching from entering die cavity 48. Then, as punch 31 approaches shutter 52 on the downward stroke, the shutter moves to the position shown in FIG. 3, so that the punch and layer site pass through cavity 51 therein. On the return stroke, after the punch clears shutter 52, the shutter moves, e.g., to the right, so that die cavity 48 is blocked. Thus, when punch 31 returns to its fully retracted position, any debris released from green sheet 41 is caught on shutter 52. On the return stroke, stripper 47 retains green sheet 41. It will also be noted that after a first layer site is punched into a cavity 48, die assembly 32 moves, e.g., to the right, so that the next layer site is punched in the next cavity 48. A plurality of layer sites 49 are thus stacked in each cavity 48. The stacked layer sites are then laminated and sintered to form a multilayer ceramic substrate.

It will be noted by those having skill in the art that the above descirbed method and apparatus punches each layer site from a green sheet having an array of identical layer sites thereon into a separate die cavity, where the number of cavities are equal to the number of layer sites on the green sheet. However, it will be recognized that each green sheet may include an array of different layer sites which are used for a single multilayer ceramic substrate so that all of the layer sites may be punched into a single die cavity in the proper order.

It will also be understood that since the apparatus punches individual layer sites, it is possible to preinspect each layer site on a green sheet and skip defective layer sites. A second green sheet having the same type of layer sites thereon may then be inputted to the apparatus and punched into the appropriate die cavity in place of the defective layer sites. All good layer sites on a green sheet may thus be used. This provides a yield improvement over the prior art fabrication method of superimposing multiple layer site green sheets, wherein a single defective layer site renders the entire green sheet unusable. The above described yield improvement is obtained for all multiple layer site green sheets, regardless of green sheet size.

The multilayer ceramic substrate fabrication apparatus described above employs automatic green sheet handling, a separate mapping and punching station and is capable of simultaneously punching one green sheet and mapping another green sheet. It will be understood that the green sheet handling can be manual, one sheet at a time, and that the mapping and punching functions can be combined at a single station. It will also be understood that the mapping function can be combined with a well known green sheet inspection function, as they both involve green sheet feature detection. In connection with the mapping function, it will be understood that the reference mark may be a fiducial specifically placed on the layer site for mapping purposes, or that a via (filled or open) or other existing layer site feature may be employed. It will also be understood that more than one reference mark may be employed for alignment purposes, with the average dimensional deviation being calculated. Finally, it will be understood that other alignment apparatus may be employed, e.g., the alignment apparatus disclosed in U.S. Pat. No. 4,342,090 to Caccoma et al., entitled "Batch Chip Placement System" and assigned to the assignee of the present invention.

While the invention has been particularly shown and described with reference to a preferred embodiment thereof, it will be understood by those having skill in the art that various changes in form and details may be made without departing from the spirit and scope of the invention.

We claim:

1. A method of forming a multilayer ceramic substrate comprising the steps of:
    fabricating an array of layer sites on a large area ceramic green sheet, each layer site comprising a plurality of conductive vias interconnected with a surface conductive pattern, the area of said ceramic green sheet being sufficiently large to preclude alignment of corresponding vias on superimposed large area ceramic green sheets;
    aligning a reference mark on one of said layer sites with respect to a die cavity by determining the dimensional offset of said reference mark from its nominal position and indexing said layer site with respect to said die cavity with said dimensional offset being applied such that said reference mark lies a predetermined distance from the edge of said die cavity;
    punching the aligned individual layer site into said die cavity;
    repeating said aligning and punching steps to stack a plurality of aligned and punched layer sites; and
    laminating the stacked plurality of aligned and punched layer sites to form a multilayer ceramic substrate;
    whereby the vias in the stacked layer sites are aligned notwithstanding the dimensional distortion of layer sites with respect to one another on said large area ceramic green sheet.

2. The method of claim 1 wherein said large area ceramic green sheet includes an array of layer sites for one multilayer ceramic substrate, and wherein the plurality of aligned and punched layer sites are stacked in one die cavity.

3. The method of claim 1 wherein said determining step comprises the step of:
    indexing said layer site to its nominal position with respect to a detector;
    detecting the actual position of said reference mark; and
    calculating the dimensional difference between the actual position and the nominal position.

4. The method of claim 1 wherein said reference mark is a fiducial mark on said layer site.

5. The method of claim 1 wherein said reference mark is a predetermined via on said layer site.

6. The method of claim 1 wherein said large area ceramic green sheet includes an array of identical layer sites, wherein each aligned and punched layer site is placed in a respective one of a plurality of die cavities, and wherein said aligning and punching steps are repeated on a plurality of large area ceramic green sheets each of which includes an array of identical layer sites, to thereby stack a plurality of aligned layer sites in each of said plurality of die cavities.

7. Apparatus for forming a multilayer ceramic substrate from a large area ceramic green sheet having an array of layer sites thereon, each layer site comprising a plurality of conductive vias interconnected with a surface conductive pattern, the area of said ceramic green sheet being sufficiently large to preclude alignment of corresponding vias on superimposed large area ceramic green sheets, said multilayer ceramic forming apparatus comprising;
    a die cavity for stacking layer sites therein;
    means for aligning a reference mark on a layer site with respect to said die cavity;
    means for punching an aligned layer site from a large area ceramic green sheet into said die cavity;
    whereby the vias in each stacked layer site in said die cavity are aligned notwithstanding the dimensional distortion of layer sites with respect to one another on said large area ceramic green sheet; and
    means for preventing green sheet debris from falling into said die cavity.

8. The apparatus of claim 7 further comprising a plurality of die cavities; and, means for aligning a predetermined one of said plurality of die cavities with respect to said punching means to thereby punch an aligned layer site into said predetermined one of said plurality of die cavities.

9. The apparatus of claim 7 wherein said preventing means is a shutter having an opening therein, said opening being positioned over said die cavity when said aligned layer site is punched into said die cavity, said shutter being positioned over said die cavity when said punching means is retracted from said die cavity.

10. The apparatus of claim 7 wherein said aligning means comprises:
   means for determing the dimensional offset of said referecne mark from its nominal position; and,
   means for indexing said layer site with respect to said die cavity, with said dimensional offset being applied.

* * * * *